United States Patent
Yamashita

[19]

[11] Patent Number: 6,047,167
[45] Date of Patent: Apr. 4, 2000

[54] OUTPUT POWER CONTROL DEVICE

[75] Inventor: Osamu Yamashita, Tokyo, Japan

[73] Assignee: NEC Corporation, Tokyo, Japan

[21] Appl. No.: 08/810,664

[22] Filed: Mar. 3, 1997

[30] Foreign Application Priority Data

Mar. 1, 1996 [JP] Japan ................................. 8-044384

[51] Int. Cl.$^7$ ........................................... H04B 1/04
[52] U.S. Cl. .................... 455/126; 455/127; 330/279; 330/138; 330/280
[58] Field of Search .................... 455/126, 127; 330/279, 138, 280, 129

[56] References Cited

U.S. PATENT DOCUMENTS

| 4,754,231 | 6/1988 | Sawa | 330/279 |
| 5,337,006 | 8/1994 | Miyazaki | 330/130 |
| 5,606,285 | 2/1997 | Wang et al. | 330/134 |

FOREIGN PATENT DOCUMENTS

| 412 392 | 2/1991 | European Pat. Off. . |
| 414 352 | 2/1991 | European Pat. Off. . |
| 434 294 | 6/1991 | European Pat. Off. . |
| 48-56360 | 8/1973 | Japan . |
| 62-185419 | 8/1987 | Japan . |
| 4100428 | 4/1992 | Japan . |
| 5259777 | 10/1993 | Japan . |
| 6196939 | 7/1994 | Japan . |
| 6-252797 | 9/1994 | Japan . |

*Primary Examiner*—Dwayne D. Bost
*Assistant Examiner*—Linwood C. Scott, Jr.
*Attorney, Agent, or Firm*—Sughrue, Mion, Zinn, Macpeak & Seas, PLLC

[57] ABSTRACT

A comparator (5) compares a detected voltage obtained by detecting an output power of a nonlinear amplifier (2) with a reference voltage to generate a control voltage for the nonlinear amplifier (2). The control voltage is converted into such a control voltage as to cancel the nonlinearity of the nonlinear amplifier (2) by a nonlinearity compensating circuit (7) and is supplied to the nonlinear amplifier (2). The nonlinear compensating circuit (7) is comprised of a diode (71) and a resistor (72).

9 Claims, 5 Drawing Sheets

OUTPUT POWER CONTROL DEVICE

BACKGROUND OF THE INVENTION

1. Field of the Invention

The present invention relates to an output power control circuit, and particularly to an output power control circuit of transmission signals in a time division multiplexing access (TDMA) wireless transmitter.

2. Description of the Prior Art

Conventionally, in the TDMA wireless transmitter, there is used a transmission output control circuit for controlling the level of an output of a burst-like transmission wave and the characteristic of the leading edge and trailing edge of this output.

This sort of transmission output control circuit is disclosed in, for example, Japanese Patent Unexamined Publication No. Hei 4-100428 (JP-A-4-100428).

However, since this output power control circuit uses a nonlinear power amplifier as a transmission power amplifying circuit having a negative-feedback loop, it is difficult to control the transmission output power, particularly to control the leading edge and trailing edge of the burst-like signal waveform.

Further, since a nonlinear amplifier of an active element is inserted between a directional coupler at the output side of the transmission power amplifying circuit and a detector circuit, there are problems of current consumption, enlargement of a mounting area, and increase of cost.

SUMMARY OF THE INVENTION

It is therefore an object of the present invention to solve the above described problems to provide an improved output power control device.

Another object of the present invention is to provide an output power control device to effectively control the leading edge and trailing edge of a burst signal waveform.

Still another object of the present invention is to provide an output power control device capable of realizing the curtailment of current consumption and cost, and reduction of a mounting area.

Still another object of the present invention is to provide an output power control device capable of compensating the nonlinearity of a nonlinear power amplifier as will become apparent hereinunder.

In order to achieve the above-mentioned objects, an output power control device of the present invention comprises a nonlinear power amplifier for controlling the transmission power of transmission signals, a directional coupler for separating a part of the output of the nonlinear power amplifier, a detector for obtaining a detected voltage by detecting the separated output, a reference voltage generator for generating a reference voltage, a comparator for comparing the detected voltage with the reference voltage to output the difference therebetween as a first control voltage, and a nonlinearity compensating circuit for converting the first control voltage into a second control voltage having a characteristic to compensate the nonlinearity of the nonlinear power amplifier so that the second control voltage is made a control signal for varying the amplification factor of the nonlinear power amplifier.

The second control voltage preferably has nonlinearity.

The nonlinearity compensating circuit is preferably comprised of a parallel circuit of a diode and a resistor.

The nonlinear power amplifier may be comprised of a variable power amplifier and a fixed power amplifier, and the second control voltage may be supplied to the variable power amplifier.

Also, an output power control device of the present invention comprises a nonlinear power amplifier for controlling transmission power in accordance with a control signal, a waveform generating circuit for outputting a signal waveform as a reference, and a nonlinearity compensating circuit for converting the signal waveform into a control voltage having a characteristic to compensate the nonlinearity of the nonlinear power amplifier.

A method of controlling an output power according to the present invention is a method of controlling the power of a transmission signal as the output of a nonlinear power amplifier, the method comprising the steps of detecting a voltage corresponding to the power of the transmission signal, comparing the detected voltage with a reference voltage to obtain the difference therebetweeen, generating a first control voltage corresponding to the obtained difference, converting the first control voltage into a second control voltage having a characteristic to compensate the nonlinearity of the nonlinear power amplifier so that the second control voltage is made a control signal for varying the amplification factor of the nonlinear power amplifier.

In the output power control device of the present invention, the nonlinearity compensating circuit is provided between the comparator and the nonlinear power amplifier, and the control voltage outputted from the comparator is converted into the control voltage having the nonlinearity and is supplied to the nonlinear power amplifier. According to this, the nonlinearity of the output power of the nonlinear power amplifier can be compensated to be brought close to the linearity. Accordingly, the leading edge and trailing edge of the burst signal becomes gentle and widening of the spectrum can be prevented.

BRIEF DESCRIPTION OF THE DRAWINGS

These and other objects, features and advantages of this invention will become more fully apparent from the following detailed description taken with the accompanying drawings in which.

In the drawings, the same reference numerals denote the same structural elements.

DESCRIPTION OF THE PREFERRED EMBODIMENTS

First, to facilitate an understanding of the present invention, the prior arts will be described with reference to FIGS. 1 and 2.

Figure 1:
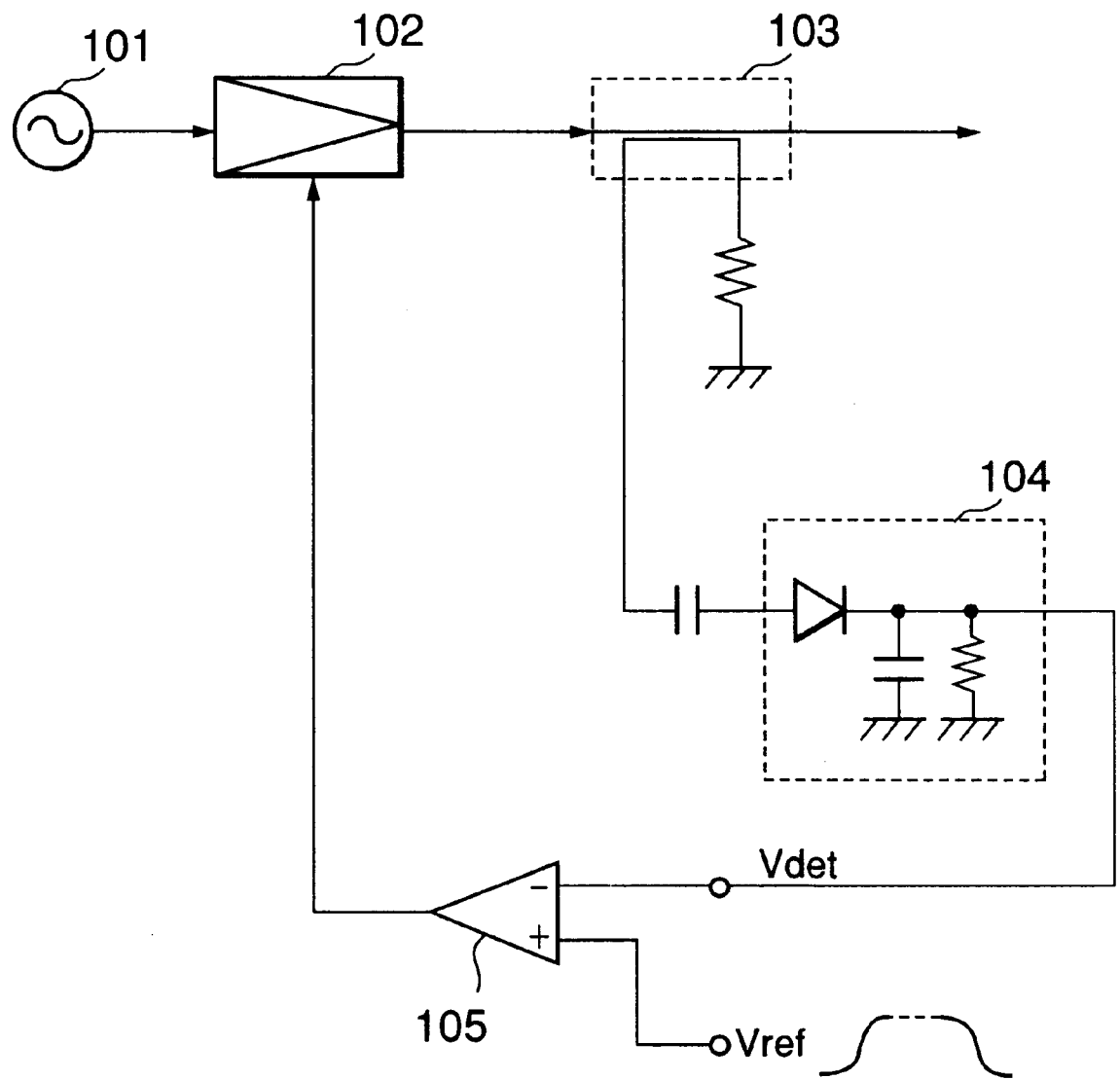
FIG. 1 is a structural block diagram showing a conventional output power control circuit.

In FIG. 1, an output power control circuit comprises an automatic power control (APC) circuit constituting a negative-feedback loop. The output power control circuit comprises a transmission VCO 101, a transmission power amplifying circuit 102, a directional coupler 103, a detector circuit 104, and a comparison error amplifier 105.

The power of an output signal from the transmission VCO 101 is amplified by the transmission power amplifying circuit 102. A part of the amplified signal is branched by the directional coupler 103 to be supplied to the detector circuit 104. The output signal detected by the detector circuit 104 is compared with a reference waveform by the comparative error amplifier 105. A control voltage corresponding to the comparison result is supplied to the transmission power amplifying circuit 102. The power amplifying circuit 102 applies an amplification factor corresponding to the control voltage to the signal from the transmission VCO 101.

Figure 2:
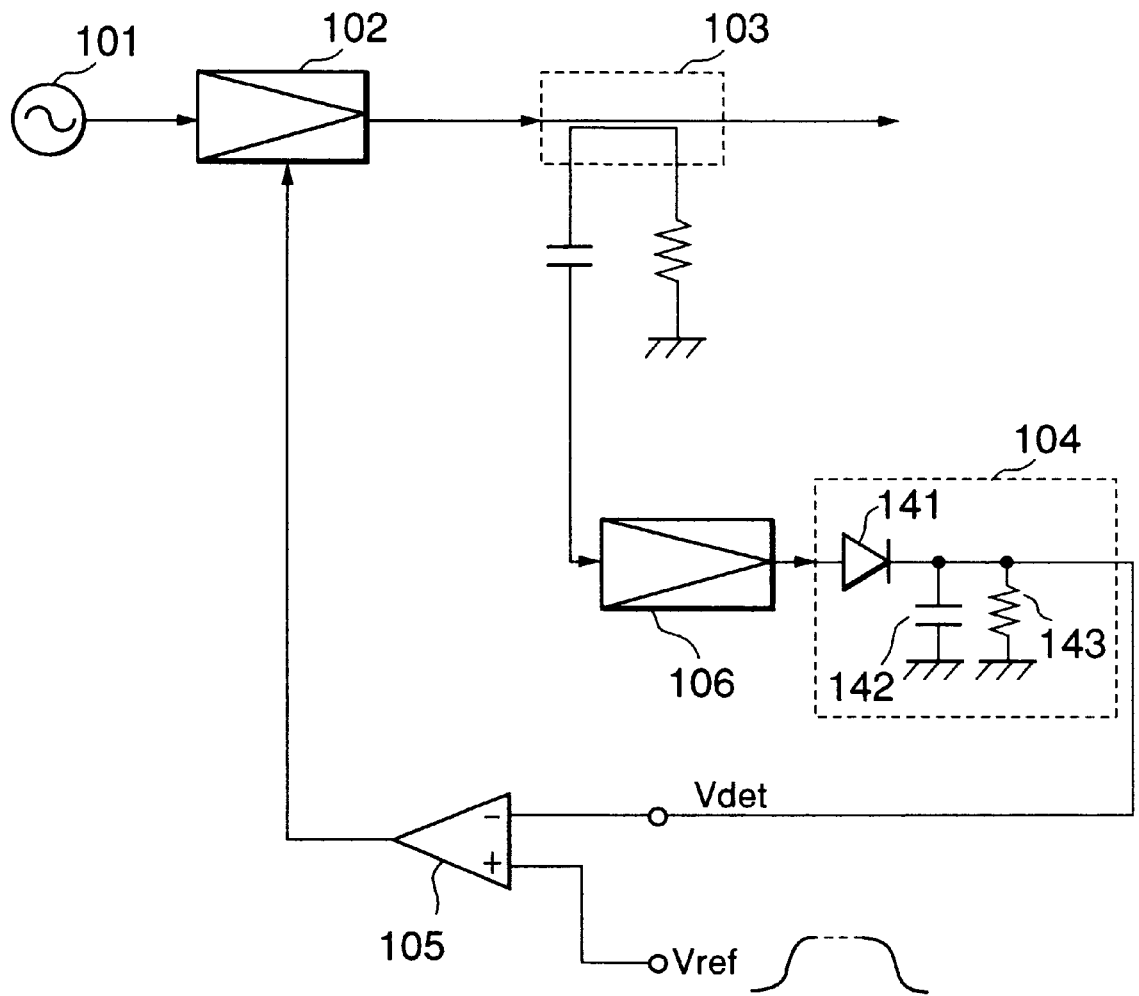
FIG. 2 is a structural block diagram showing another conventional output power control circuit.

FIG. 2 shows an output power control circuit for controlling the transmission output over a wide dynamic range with superior reproductivity by compensating the narrow dynamic range of a detector circuit.

This output control circuit comprises a nonlinear amplifier 106 between a directional coupler 103 and a detector circuit 104. Other components are the same as those in FIG. 1. The nonlinear amplifier 106 is a high frequency logarithmic amplifier or a saturation type amplifier having input/output characteristics comparatively similar to the former amplifier. The nonlinear amplifier has such characteristics that the gain is decreased as the input is increased.

However, in these output control circuits, as described before, because of the nonlinear power amplifier as the transmission power amplifying circuit, it is difficult to control the leading edge and trailing edge of the burst-like signal waveform.

Further, since the nonlinear amplifier as an active element is inserted between the directional coupler and the detector circuit, there are problems of current consumption, enlargement of a mounting area, and increase of cost.

Next, the present invention will be described in detail with reference to the drawings.

Figure 3:
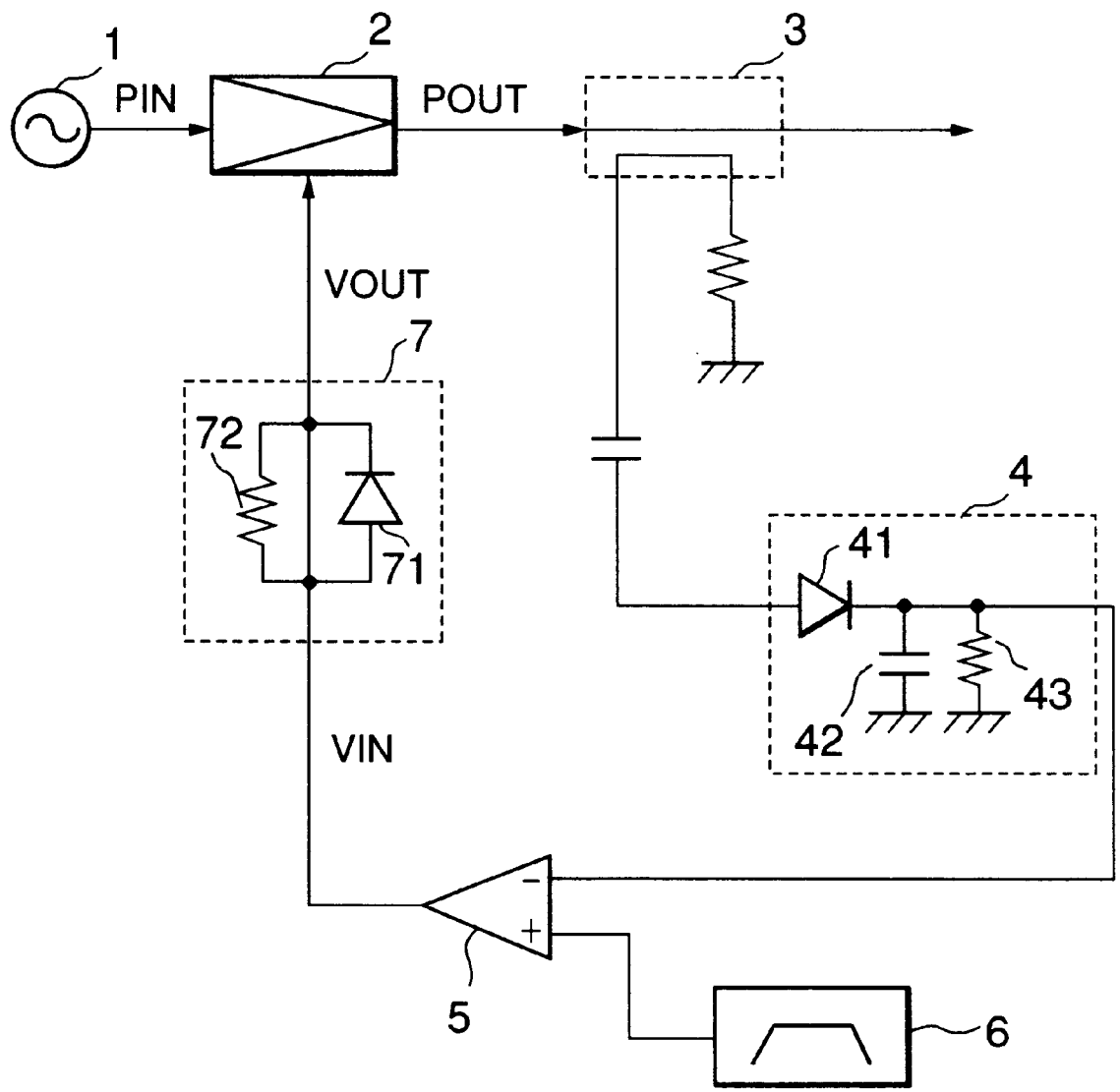
FIG. 3 is a structural block diagram showing a preferred embodiment of the present invention.

FIG. 3 is a structural block diagram showing an output power control circuit according to a first embodiment of the present invention.

In FIG. 3, the output power control circuit comprises a transmission signal oscillator 1, a nonlinear power amplifier 2, a directional coupler 3, a detector circuit 4, a comparator 5, a reference signal generator 6, and a nonlinearity compensating circuit 7.

The detector circuit 4 comprises a diode 41, a capacitor 42, and a resistor 43.

The nonlinearity compensating circuit 7 comprises a diode 71 and a resistor 72. The diode 71 and the resistor 72 are connected in parallel to each other, an anode of the diode 71 is connected to the comparator 5, and a cathode thereof is connected to the nonlinear power amplifier 2.

Next, the operation of the output power control circuit shown in FIG. 3 will be described.

A transmission signal PIN from the transmission signal oscillator 1 is inputted into the nonlinear amplifier 2 and is amplified. A part of an output signal POUT of the nonlinear amplifier 2 is separated by the directional coupler 3, and is supplied to the detector circuit 4 through a capacitor.

The detected signal detected by the detector circuit 4 is compared with a reference signal from the reference signal generator 6 by the comparator 5, and is converted into a control voltage VIN corresponding to the comparison result indicating the difference. The waveform of the reference signal from the reference signal generator 6 is almost trapezoid like the burst-like signal waveform.

The control signal from the comparator 5 is supplied to the nonlinearity compensating circuit 7. As will be described later, the nonlinearity compensating circuit 7 imparts a characteristic, by which the nonlinearity of the nonlinear power amplifier 2 with respect to a control voltage versus an output power is canceled, to the control voltage VIN. The nonlinearity compensating circuit 7 converts the control voltage VIN of the comparator 5 into a control voltage VOUT having nonlinearity to cancel nonlinearity appearing in the output of the nonlinear power amplifier 2, and supplies the control voltage VOUT to the nonlinear amplifier 2.

The nonlinear amplifier 2 applies an amplification factor corresponding to the control voltage VOUT to the input signal PIN and outputs the output signal POUT improved in the nonlinear characteristics.

Figure 4A:
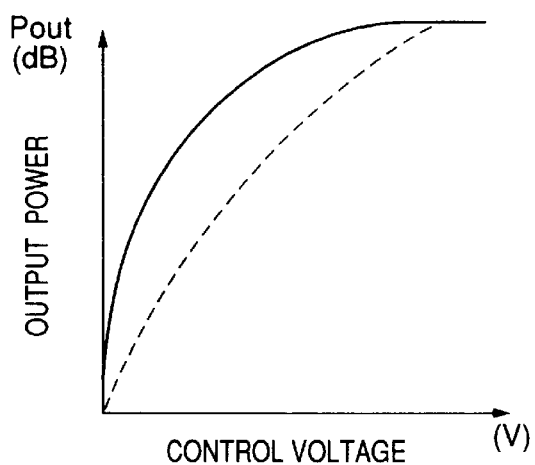
FIGS. 4(a) to 4(c) are views showing signal waveforms in the main part of the present invention.
Figure 4B:
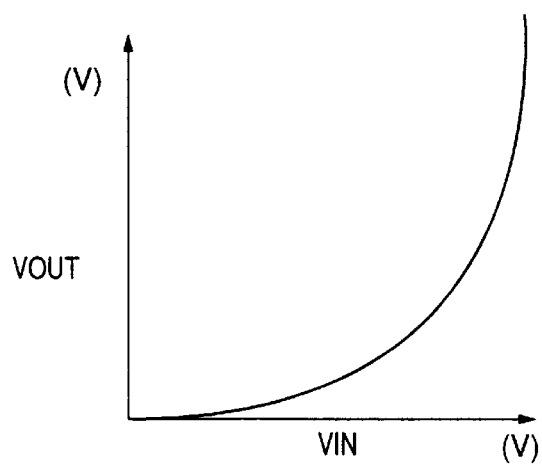
Figure 4C:
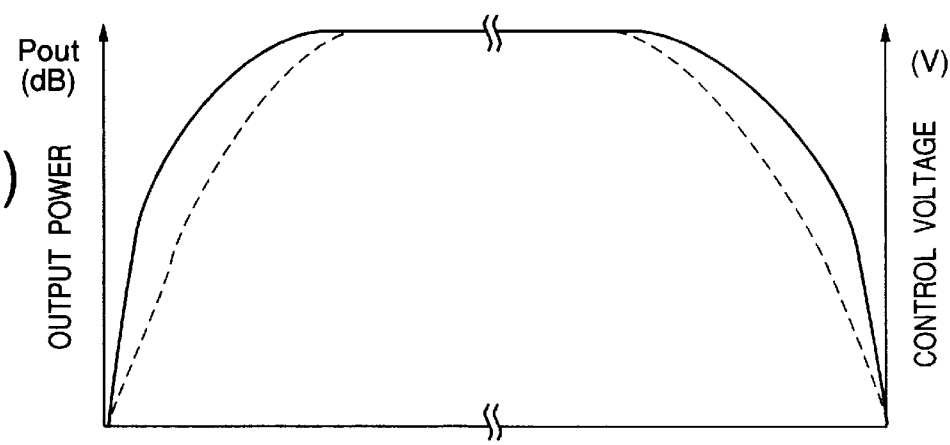

FIGS. 4(a) to 4(c) are views showing waveforms of a main circuit, which indicate the characteristics according to the present invention described above.

FIG. 4(a) is a view showing the relation between the control voltage supplied to the nonlinear power amplifier and the output power of the nonlinear power amplifier. In the drawing, a solid line indicates the relation between the control voltage and the output power POUT in a conventional nonlinear amplifier. A broken line indicates the relation between the control voltage VOUT and the power of the output signal POUT according to the present invention.

FIG. 4(b) shows input/output characteristics of the nonlinearity compensating circuit of the present invention. By this characteristics, it is possible to supply the control voltage VOUT having nonlinearity to the nonlinear amplifier.

FIG. 4(c) is a view showing the relation between the control voltage supplied to the nonlinear power amplifier and the output power of the nonlinear power amplifier with respect to the time (t) axis. In the drawing, a solid line indicates a burst signal waveform in the case of having the conventional relation between the control voltage and the output power, and a broken line indicates a burst signal waveform in the case of having the relation of the present invention between the control voltage and the output power.

When the control voltage as shown in FIG. 4(b) is supplied to the nonlinear power amplifier, the nonlinearity in the output power of the nonlinear power amplifier can be compensated to be brought close to the linearity as shown in FIG. 4(a). Thus, as is apparent from FIG. 4(c), the leading edge and trailing edge of the burst signal waveform becomes gentle, so that the widening of the spectrum can be prevented.

Figure 5:
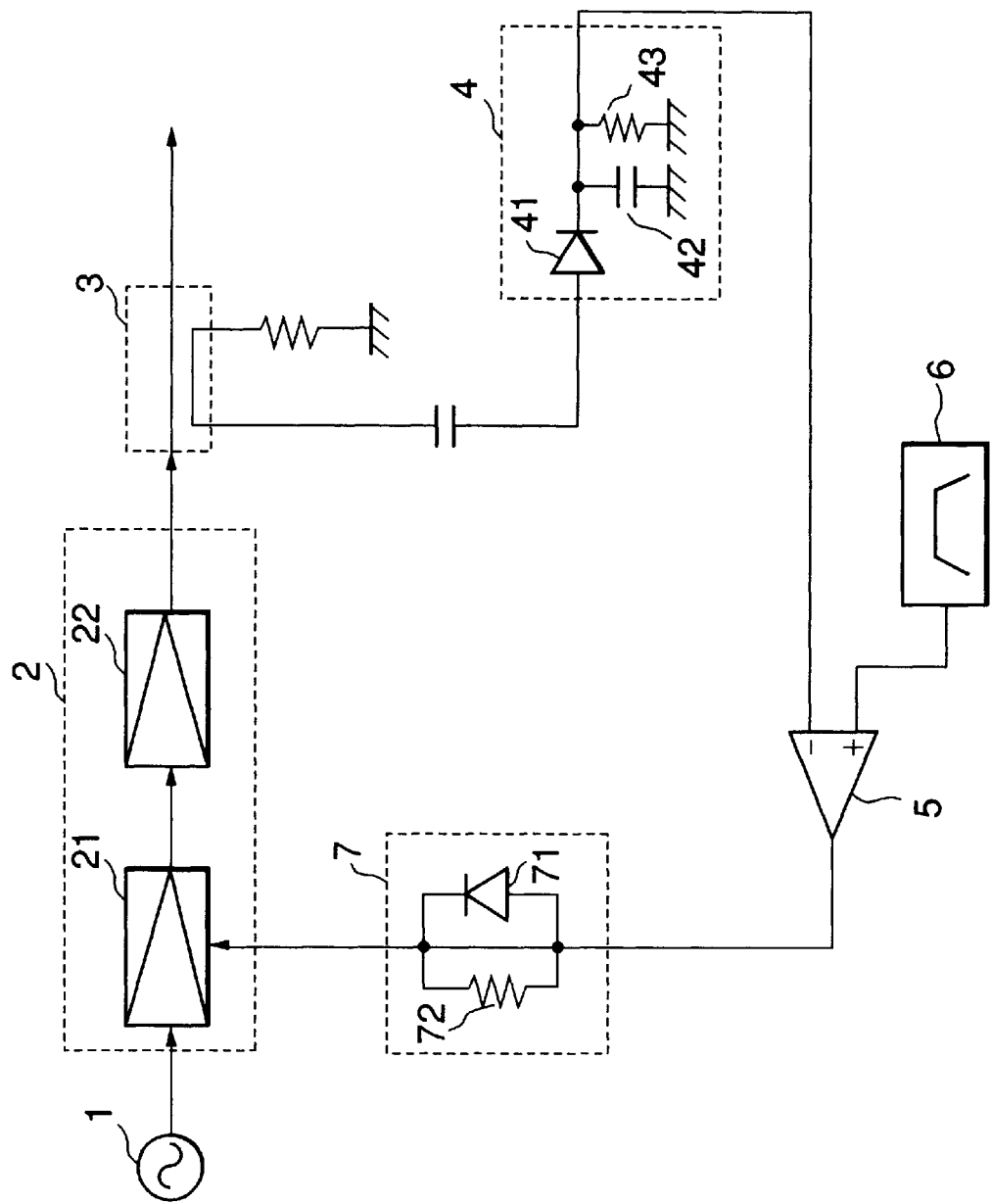
FIG. 5 is a structural block diagram showing another preferred embodiment of the present invention.

FIG. 5 is a structural block diagram showing another embodiment of the present invention.

In FIG. 5, an output power control circuit comprises a transmission signal oscillator 1, a nonlinear power amplifier 2, a directional coupler 3, a detector circuit 4, a comparator 5, a reference signal generator 6, and a nonlinearity compensating circuit 7. The nonlinear power amplifier 2 comprises a variable power amplifier 21 and a fixed power amplifier 22. The nonlinearity compensating circuit 7 comprises a diode 71 and a resistor 72 connected in parallel with each other. An anode of the diode 71 is connected to the comparator 5, and a cathode thereof is connected to the nonlinear power amplifier 2.

Next, the operation of the output power control circuit shown in FIG. 5 will be described.

A transmission signal from the transmission signal oscillator 1 is supplied to the variable power amplifier 21 of the nonlinear amplifier 2, and is amplified in accordance with the control voltage from the nonlinearity compensating circuit 7. The output of the variable power amplifier 21 is amplified by the fixed power amplifier 22 at a constant value, and is supplied to the directional coupler 3.

A part of the output signal of the fixed power amplifier 22 is separated by the directional coupler 3, and is supplied to the detector circuit 4 through a capacitor. The detected voltage of the output signal detected by the detector circuit 4 is compared with a reference voltage from the reference signal generator 6 by the comparator 5, and is converted into a control voltage corresponding to the comparison result indicating the difference. The waveform of the reference signal is almost trapezoid like the burst signal waveform.

The control voltage from the comparator 5 is supplied to the nonlinearity compensating circuit 7. The nonlinearity compensating circuit 7 is a circuit for imparting a characteristic, by which the nonlinearity of the nonlinear power amplifier 2 with respect to a control voltage versus an output power is canceled, to the control voltage. The nonlinearity compensating circuit 7 converts the control voltage VIN of the comparator 5 into the control voltage VOUT having nonlinearity to cancel nonlinearity appearing in the output of the nonlinear power amplifier 2, and supplies the control voltage VOUT to the nonlinear amplifier 2.

The nonlinear amplifier 2 applies an amplification factor corresponding to the control voltage to the input signal, and outputs an output signal improved in the nonlinearity.

Also in this embodiment, the characteristics as shown in FIGS. 4(a) to 4(c) are obtained and the nonlinear characteristics of the nonlinear amplifier can be compensated.

In the above described embodiments, although the output power control circuit with a negative-feedback loop has been described, the present invention is not limited to this, but can be applied to an output power control circuit without the negative-feedback loop. This case can be realized by inserting the nonlinearity compensating circuit between the reference signal generator and the nonlinear amplifier.

As described above, in the output power control circuit of the present invention, the nonlinearity compensating circuit supplies a control voltage, which has a characteristic to cancel the nonlinear characteristics of the nonlinear power amplifier with respect to the output signal versus the control signal, to the nonlinear power amplifier, so that the control of the output power of the nonlinear power amplifier can be easily carried out. Particularly, power control of a burst signal waveform at the leading edge and trailing edge can be precisely carried out.

Further, the nonlinearity compensating circuit is realized by the parallel circuit of the diode and the resistor, so that it is possible to provide the compact and economic output power control circuit.

While the invention has been described with reference to specific embodiments thereof, it will be appreciated by those skilled in the art that numerous variations, modifications, and embodiments are possible, and accordingly, all such variations, modifications, and embodiments are to be regarded as being within the spirit and scope of the invention.

What is claimed is:

1. An output power control device for a transmission signal, comprising:
   a nonlinear power amplifier for controlling transmission power of said transmission signal;
   a directional coupler for separating a part of an output of said nonlinear power amplifier;
   a detector for obtaining a detected voltage by detecting said separated output;
   a reference voltage generator for generating a reference voltage;
   a comparator for comparing said detected voltage with said reference voltage to output the difference between as a first control voltage; and
   a nonlinearity compensating circuit for converting said first control voltage into a second control voltage having a characteristic to compensate nonlinearity of said nonlinear power amplifier so that said second control voltage is made a control signal for varying an amplification factor of said nonlinear power amplifier.

2. An output power control device as claimed in claim 1, wherein said nonlinearity compensating circuit comprises a parallel circuit of a diode and a resistor.

3. An output power control device as claimed in claim 1, wherein said nonlinear power amplifier comprises a variable power amplifier and a fixed power amplifier, and said second control voltage is supplied to said variable power amplifier.

4. An output power control device as claimed in claim 1, wherein said second control voltage has nonlinearity.

5. An output power control device for a transmission signal, comprising:
   nonlinear power amplifying means for controlling transmission power of said transmission signal;
   separating means for separating a part of an output of said nonlinear power amplifying means;
   detector means for detecting said separated output to obtain a detected voltage;
   reference voltage generating means for generating a reference voltage;
   comparing means for comparing said detected voltage with said reference voltage to output the difference between as a first control voltage; and
   nonlinearity compensating means for converting said first control voltage to a second control voltage having a characteristic to compensate nonlinearity of said nonlinear power amplifying means so that said second control voltage is made a control signal for varying an amplification factor of said nonlinear power amplifying means.

6. An output power control device as claimed in claim 5, wherein said nonlinearity compensating means comprises a parallel circuit of a diode and a resistor.

7. An output power control device as claimed in claim 5, wherein said nonlinear power amplifying means comprises a variable power amplifier and a fixed power amplifier, and said second control voltage is supplied to said variable power amplifier.

8. An output power control device as claimed in claim 5, wherein said second control voltage has nonlinearity.

9. A method of controlling power of a transmission signal as an output of a nonlinear power amplifier, said method comprising the steps of:
   detecting a voltage corresponding to power of a transmission signal;
   obtaining a difference by comparing said detected voltage with a reference voltage;
   generating a first control voltage corresponding to said obtained difference;
   converting said first control voltage into a second control voltage having a characteristic to compensate nonlinearity of said nonlinear power amplifier; and
   making said second control voltage a control signal for varying an amplification factor of said nonlinear power amplifier.

* * * * *